United States Patent
Hoang et al.

(10) Patent No.: US 9,203,352 B1
(45) Date of Patent: Dec. 1, 2015

(54) TECHNIQUES FOR NOISE REDUCTION DURING CALIBRATION

(71) Applicant: Altera Corporation, San Jose, CA (US)

(72) Inventors: Tim Tri Hoang, San Jose, CA (US); Rabindranath Balasubramanian, Dublin, CA (US)

(73) Assignee: Altera Corporation, San Jose, CA (US)

(*) Notice: Subject to any disclaimer, the term of this patent is extended or adjusted under 35 U.S.C. 154(b) by 153 days.

(21) Appl. No.: 13/952,412

(22) Filed: Jul. 26, 2013

(51) Int. Cl.
    H03F 1/26 (2006.01)
    H03F 3/193 (2006.01)
    H03F 3/45 (2006.01)

(52) U.S. Cl.
    CPC .............. *H03F 1/26* (2013.01); *H03F 3/193* (2013.01); *H03F 3/45179* (2013.01); *H03F 3/45475* (2013.01)

(58) Field of Classification Search
    CPC ............ H03F 1/3241; H03F 2200/331; H03F 1/0205; H03F 1/3294; H03F 1/52; H03F 2200/375; H03F 2200/435; H03F 2200/451; H03F 2200/456; H03F 2200/462; H03F 2200/471; H03F 2200/541; H03F 2203/45371
    USPC ........................................ 330/9; 327/124, 307
    See application file for complete search history.

(56) References Cited

U.S. PATENT DOCUMENTS

| | | | |
|---|---|---|---|
| 6,985,030 B2 * | 1/2006 | Shimizu et al. | 330/9 |
| 7,924,089 B2 * | 4/2011 | Tanaka et al. | 330/9 |
| 8,335,249 B1 | 12/2012 | Su et al. | |
| 8,847,677 B2 * | 9/2014 | Nagashima | 330/9 |
| 2007/0008035 A1 * | 1/2007 | Liu et al. | 330/253 |

* cited by examiner

*Primary Examiner* — Khanh V Nguyen
(74) *Attorney, Agent, or Firm* — Steven J. Cahill (57) ABSTRACT

A circuit includes a first amplifier circuit and a second amplifier circuit. The second amplifier circuit includes an input coupled to an output of the first amplifier circuit. A pass gate circuit is coupled between first and second inputs of the first amplifier circuit. The pass gate circuit is on during calibration of the second amplifier circuit to short together signals at the first and the second inputs of the first amplifier circuit. The pass gate circuit is off during a normal mode of the first and the second amplifier circuits.

20 Claims, 10 Drawing Sheets

TECHNIQUES FOR NOISE REDUCTION DURING CALIBRATION

FIELD OF THE DISCLOSURE

The present disclosure relates to electronic circuits, and more particularly, to techniques for noise reduction during calibration.

BACKGROUND

Many integrated circuits (ICs) are designed to receive and to transmit high-speed digital data signals. Data signals are transmitted between devices (e.g., integrated circuits) in a circuit system through a connector, such as a circuit board or backplane. A data signal that is transmitted between devices in a circuit system through a connector may become attenuated. The attenuation of the transmitted data signal may be frequency-dependent.

For example, a data signal transmitted through a connector may receive more attenuation at higher frequencies than at lower frequencies. The waveform of the data signal as received at a receiving device may contain a significant amount of distortion caused by the greater attenuation at higher frequencies. To compensate for these changes in the waveform of the data signal, an equalizer in the receiving device boosts the high frequency components of the data signal to recover the components of the data signal attenuated through the connector.

BRIEF SUMMARY

According to some embodiments, a circuit includes a first amplifier circuit and a second amplifier circuit. The second amplifier circuit includes an input coupled to an output of the first amplifier circuit. A pass gate circuit is coupled between first and second inputs of the first amplifier circuit. The pass gate circuit is on during calibration of the second amplifier circuit to short signals at the first and second inputs of the first amplifier circuit. The pass gate circuit is off during a normal mode.

According to other embodiments, a circuit includes a first amplifier circuit and a second amplifier circuit that has an input coupled to an output of the first amplifier circuit. A termination circuit is coupled to an input of the first amplifier circuit. A pass gate circuit is coupled in parallel with the termination circuit. The pass gate circuit is on during calibration of the second amplifier circuit to short the termination circuit. The pass gate circuit is off during a normal mode.

According to further embodiments, a circuit includes a first amplifier circuit. The first amplifier circuit has a differential pair of first and second transistors, a first load circuit coupled to a terminal of the first transistor, a second load circuit coupled to a terminal of the second transistor, a third transistor coupled to the first load circuit, and a fourth transistor coupled to the second load circuit. The circuit also includes a second amplifier circuit that has an input coupled to an output of the first amplifier circuit. The third transistor is on during calibration of the second amplifier circuit to short the terminal of the first transistor to a supply rail. The fourth transistor is on during the calibration of the second amplifier circuit to short the terminal of the second transistor to the supply rail. The third and the fourth transistors are off during a normal mode.

Various objects, features, and advantages of the present invention will become apparent upon consideration of the following detailed description and the accompanying drawings.

DETAILED DESCRIPTION

According to some embodiments disclosed herein, an equalizer compensates for distortion in an input signal that has been transmitted through transmission lines during a normal mode. The equalizer includes multiple stages of amplifier circuits. The amplifier circuits in the equalizer may generate an offset in the output signal of the equalizer relative to the input signal of the equalizer. During a calibration mode, the first stage amplifier circuit in the equalizer is off, and an offset calibration circuit determines a cumulative offset of the other stages of amplifier circuits in the equalizer. The offset calibration circuit cancels the cumulative offset of the other stages of amplifier circuits during the normal mode of the equalizer.

The input signal provided to the equalizer may continue to vary during the calibration mode. Variations in the input signal may propagate through the first stage amplifier circuit even when the first stage amplifier circuit is off. If variations in the input signal propagate through the first stage amplifier circuit to the other stages of amplifier circuits in the equalizer during calibration mode, the offset calibration circuit may not be able to accurately determine the cumulative offset of the other stages of amplifier circuits.

According to some embodiments, input signals to the first stage amplifier circuit are shorted together through a pass gate circuit to reduce variations (i.e. noise) in the output signal of the first stage amplifier circuit during calibration mode. According to other embodiments, pass gate circuits coupled in parallel with load circuits short output nodes of the first stage amplifier circuit to a supply rail to reduce variations in the output signal of the first stage amplifier circuit during calibration mode. According to further embodiments, pass gate circuits short signals across termination circuits that are coupled to inputs of the first stage amplifier circuit to reduce variations in the output signal of the first stage amplifier circuit during calibration mode.

Figure 1:
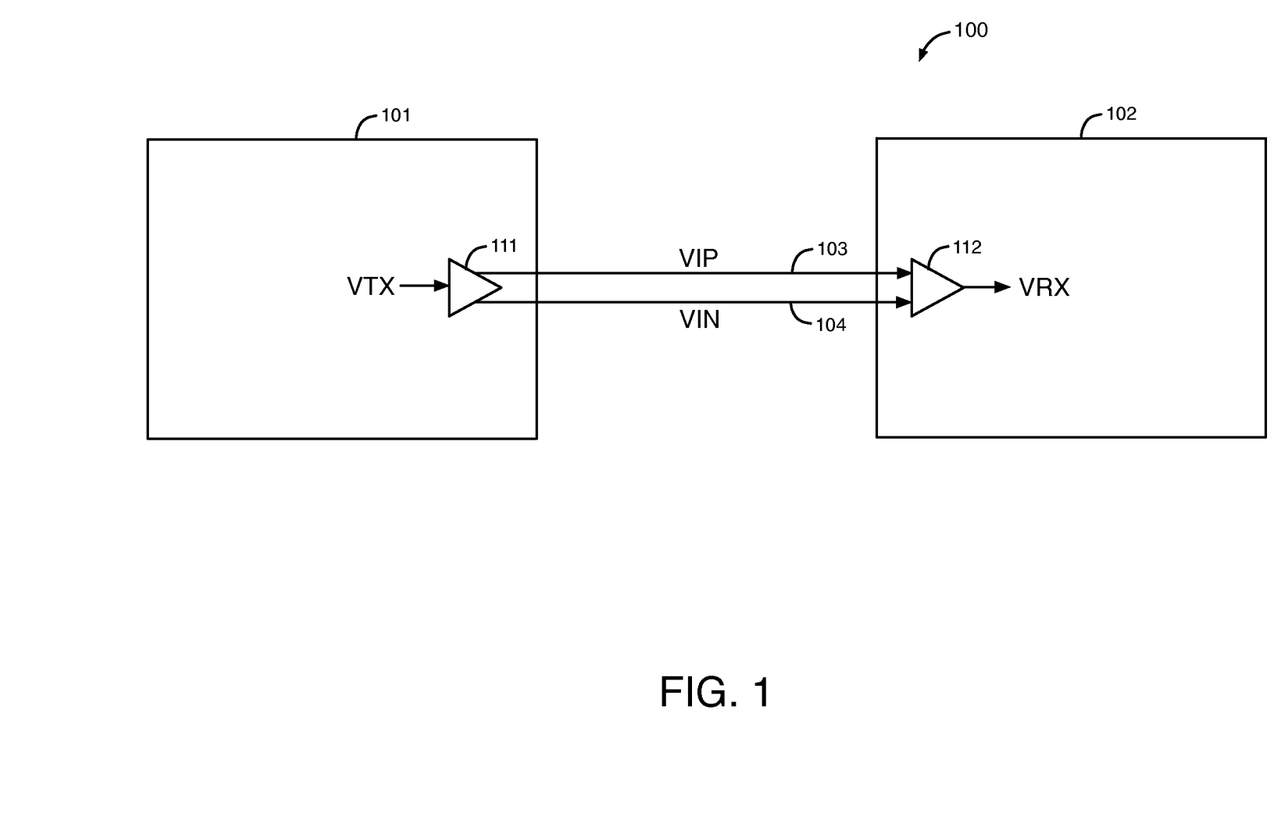
FIG. 1 illustrates an example of a circuit system, according to an embodiment of the present invention.

FIG. 1 illustrates an example of a circuit system 100, according to an embodiment of the present invention. Circuit system 100 includes two integrated circuits 101-102 and two transmission lines 103-104. Integrated circuit 101 includes a transmitter circuit 111. Integrated circuit 102 includes an equalizer circuit 112. Integrated circuits 101 and 102 are connected through a connector, such as a circuit board or backplane. Transmission lines 103-104 are in the connector. Transmitter circuit 111 is coupled to equalizer circuit 112 through transmission lines 103-104.

In circuit system 100, integrated circuit 101 functions as a transmitting device, and integrated circuit 102 functions as a receiving device. Transmitter circuit 111 receives an input signal VTX from other circuitry in integrated circuit 101. Input signal VTX may be single-ended or differential. Transmitter circuit 111 buffers input signal VTX to generate a differential output signal that equals the difference between signals VIP and VIN (i.e., VIP−VIN). Differential signal VIP−VIN may be, for example, a serial data signal. As another example, differential signal VIP−VIN may be one of a set of parallel data signals. Signals VIP and VIN are transmitted through transmission lines 103-104, respectively, to inputs of equalizer circuit 112 in integrated circuit 102. Transmission lines 103-104 form a communication channel for differential signal VIP−VIN. Equalizer circuit 112 generates an output signal VRX based on differential signal VIP−VIN. Signal VRX may be single-ended or differential.

Figure 2:
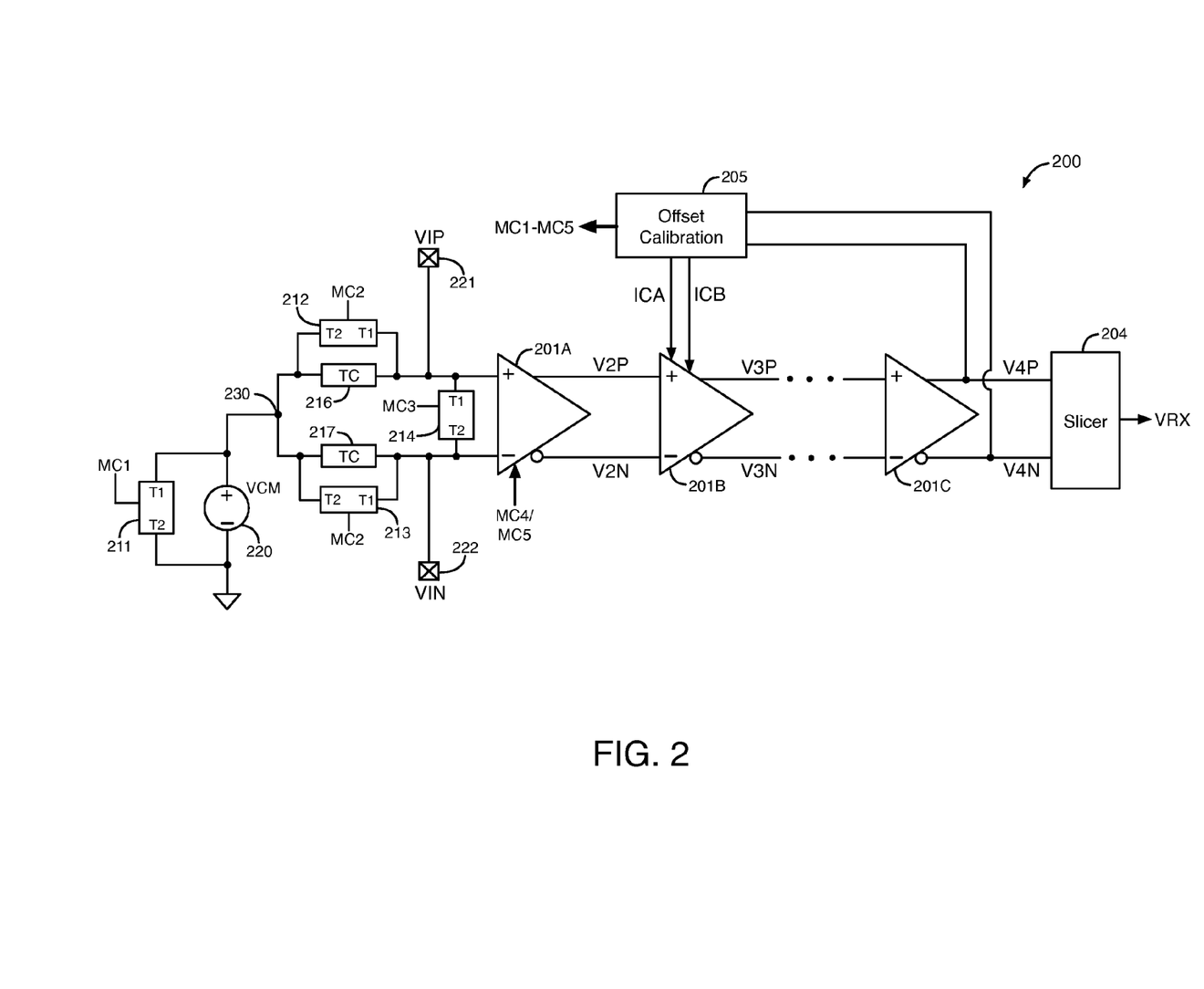
FIG. 2 illustrates an equalizer circuit, according to an embodiment of the present invention.

FIG. 2 illustrates an equalizer circuit 200, according to an embodiment of the present invention. Equalizer circuit 200 is an example of equalizer circuit 112 shown in FIG. 1. Equalizer circuit 200 includes two or more stages of differential amplifier circuits 201 that are coupled in series. In the example of FIG. 2, equalizer circuit 200 includes differential amplifier circuits 201A-201C. Equalizer circuit 200 also includes slicer circuit 204, offset calibration circuit 205, on-chip termination circuits 216-217, pass gate circuits 211-214, and common mode voltage source 220.

Equalizer circuit 200 is coupled to pins 221-222 of integrated circuit 102. Pins 221-222 are external terminals of integrated circuit 102. Pins 221-222 may, for example, be conductive areas on a surface of integrated circuit 102. Signals VIP and VIN are received from transmission lines 103 and 104 at inputs of equalizer circuit 200 through pins 221 and 222, respectively. Pins 221 and 222 are coupled to the non-inverting (+) and inverting (−) inputs, respectively, of differential amplifier circuit 201A.

A first mode control signal MC1 is provided to an input of pass gate circuit 211. A second mode control signal MC2 is provided to inputs of pass gate circuits 212-213. A third mode control signal MC3 is provided to an input of pass gate circuit 214. Offset calibration circuit 205 generates mode control signals MC1-MC3, as well as two additional mode control signals MC4-MC5.

Equalizer circuit 200 functions in at least two modes of operation. The two modes of operation of equalizer circuit 200 are a normal mode and a calibration mode.

During the normal mode, mode control signals MC1-MC3 are grounded, causing pass gate circuits 211-214 to be off and non-conductive.

Signals VIP and VIN are received at the non-inverting (+) and inverting (−) inputs, respectively, of differential amplifier circuit 201A. Termination circuits 216-217 are coupled in series between pins 221-222. Common mode voltage source 220 is coupled between termination circuits 216-217 at node 230 and a supply rail at ground (i.e., the ground voltage). Common mode voltage source 220 generates a common mode voltage VCM at node 230 when pass gate circuit 211 is off. Voltage VCM is the common mode voltage of input signals VIP and VIN.

During the normal mode of equalizer circuit 200, pass gate circuits 211-214 are off, and termination circuits 216-217 provide termination resistance to signals VIP and VIN to reduce signal reflection in transmission lines 103-104. The impedances of termination circuits 216-217 may be selected to equal the characteristic impedances of transmission lines 103-104. Termination circuits 216-217 may include passive resistors and/or transistors. If termination circuits 216-217 include transistors, an on-chip termination calibration circuit (not shown) calibrates the drain-to-source resistances of the transistors in termination circuits 216-217.

During normal mode, differential amplifier circuit 201A generates two output signals V2P and V2N based on input signals VIP and VIN. Differential amplifier circuit 201A buffers differential signal VIP−VIN to generate a differential output signal that equals the difference between signals V2P and V2N (i.e., V2P−V2N). Differential amplifier circuit 201B generates two output signals V3P and V3N based on signals V2P and V2N. Differential amplifier circuit 201B buffers differential signal V2P−V2N to generate a differential output signal that equals the difference between signals V3P and V3N (i.e., V3P−V3N).

Differential amplifier circuit 201C generates two output signals V4P and V4N based on the output signals of the previous stage differential amplifier circuit 201. The previous stage differential amplifier circuit 201 may be differential amplifier circuit 201B or another differential amplifier circuit 201 that is coupled in series between circuits 201B-201C. Differential amplifier circuit 201C buffers the differential output signal of the previous stage differential amplifier circuit 201 to generate a differential signal that equals the difference between signals V4P and V4N (i.e., V4P−V4N).

Signals V4P and V4N are provided to inputs of slicer circuit 204 and to inputs of offset calibration circuit 205. Slicer circuit 204 stores the bits (e.g., data bits) indicated by differential signal V4P−V4N in output signal VRX. Slicer circuit 204 may be, for example, a flip-flop circuit or a sense amplifier circuit that stores bits indicated by differential signal V4P−V4N in output signal VRX in response to a periodic signal.

Differential signal VIP−VIN may become attenuated while being transmitted through transmission lines 103-104. The attenuation in differential signal VIP−VIN may be frequency-dependent. Differential signal VIP−VIN may experience more attenuation at higher frequencies than at lower frequencies, which causes distortion in the waveform of differential signal VIP−VIN as received at pins 221-222.

In some embodiments, the differential amplifier circuits 201 in equalizer circuit 200 have a high frequency voltage gain that is greater than 0 decibels (dB). To compensate for distortion in the waveform of differential signal VIP−VIN, differential amplifier circuits 201 amplify the high frequency components of differential signal VIP−VIN to generate differential signal V4P−V4N. Differential amplifier circuits 201 recover the high frequency components of differential signal VIP−VIN that were lost in transmission lines 103-104. The recovered high frequency components of differential signal VIP−VIN are generated in differential signal V4P−V4N. Differential amplifier circuits 201 have a small voltage gain that is near 0 decibels for the low frequency components of differential signal VIP−VIN. Differential amplifier circuits 201 have a high pass transfer function in this embodiment.

In other embodiments, the differential amplifier circuits 201 in equalizer circuit 200 may have any suitable transfer function. For example, one or more of differential amplifier circuits 201 may function as a buffer circuit that has a voltage gain near 0 decibels for low frequency and high frequency components of its respective differential input signal.

Each of the differential amplifier circuits 201 in equalizer circuit 200 includes a differential pair of n-channel metal oxide semiconductor field-effect transistors (MOSFETs). Process variations may cause mismatches between the two transistors in a differential pair in an amplifier circuit. Mismatches between the differential pair of transistors in an amplifier circuit may cause the amplifier circuit to generate an offset in its output signal. If a differential amplifier circuit does not have an offset, then its differential output signal equals zero when its differential input signal equals zero. However, if a differential amplifier circuit has an offset, then its differential output signal is greater than or less than zero when its differential input signal equals zero.

One or more of amplifier circuits 201 may generate offsets in their output signals. Offsets in amplifier circuits 201 are dependent on the sizes and layout parameters of the transistors in the differential pairs. Offsets generated by amplifier circuits 201 may be positive or negative. During normal mode, the cumulative offset generated by amplifier circuits 201 may be large enough to generate bits in differential signal V4P–V4N having incorrect digital values. A bit in differential signal V4P–V4N has an incorrect digital value if that bit does not have the same digital value as the bit received in differential signal VIP–VIN that amplifier circuits 201 used to generate that bit in differential signal V4P–V4N.

Figure 3:
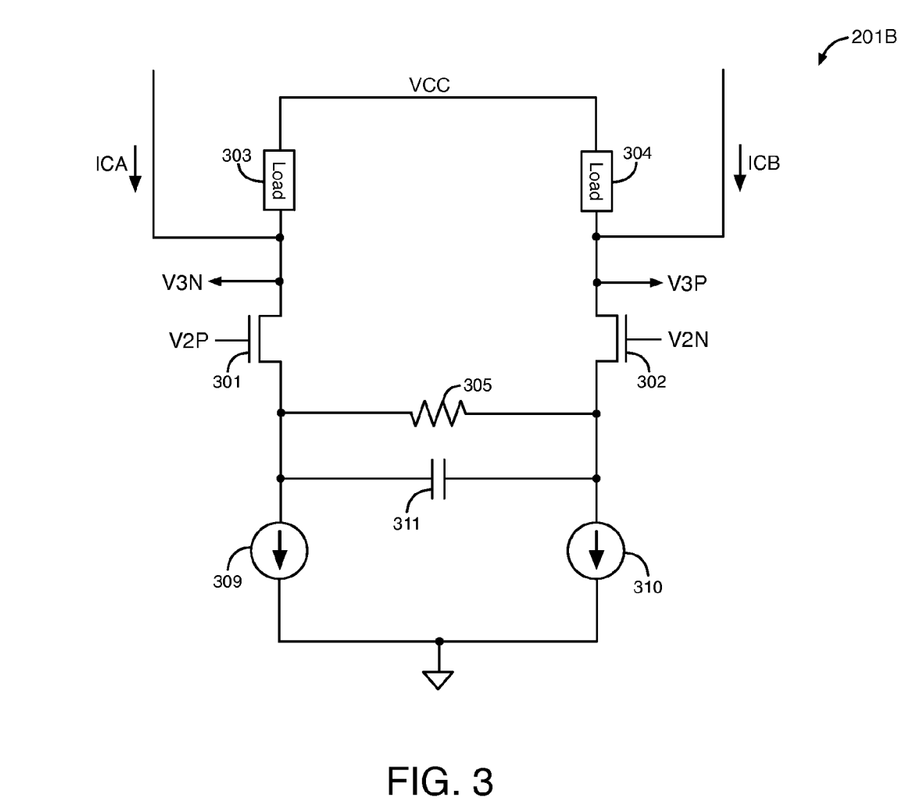
FIG. 3 illustrates an example of one of the differential amplifier circuits shown in FIG. 2, according to an embodiment of the present invention.

Differential amplifier circuit 201B is coupled to offset calibration circuit 205. Offset calibration circuit 205 generates offset cancelation currents ICA and ICB. Offset cancelation currents ICA and ICB are provided to differential amplifier circuit 201B. FIG. 3 illustrates an example of differential amplifier circuit 201B, according to an embodiment of the present invention. Differential amplifier circuit 201B includes re-channel MOSFETs 301-302, load circuits 303-304, resistor 305, current source circuits 309-310, and capacitor 311.

Load circuits 303-304 are coupled to a supply rail at a supply voltage VCC. Load circuits 303-304 may be, for example, passive resistors. Alternatively, each of the load circuits 303-304 may be a field-effect transistor.

Current source circuits 309-310 are coupled to a supply rail at the ground voltage. Transistors 301-302 are a differential pair of transistors. Resistor 305 and capacitor 311 are coupled in parallel between the sources of transistors 301-302. Signals V2P and V2N are provided to the gates of transistors 301 and 302, respectively. Signals V3P and V3N are generated at the drains of transistors 302 and 301, respectively.

Current ICA is provided to transistor 301, and current ICB is provided to transistor 302. The current through transistor 301 equals the sum of the current through load circuit 303 and current ICA during a steady state. The current through transistor 302 equals the sum of the current through load circuit 304 and the current ICB during a steady state. Currents ICA and ICB may be positive or negative.

During the calibration mode, differential amplifier circuit 201A is off. When differential amplifier circuit 201A is off during the calibration mode, the output signals V2P and V2N of amplifier circuit 201A are ideally both equal to the supply voltage VCC. If signals V2P and V2N both equal supply voltage VCC, and the cumulative offset of amplifier circuits 201B-201C equals zero, then the differential voltage signal V4P–V4N equals zero. If signals V2P and V2N both equal supply voltage VCC, and the cumulative offset of amplifier circuits 201B-201C does not equal zero, then the differential voltage signal V4P–V4N does not equal zero.

During the calibration mode, offset calibration circuit 205 adjusts currents ICA and ICB based on differential signal V4P–V4N. Offset calibration circuit 205 determines the currents ICA and ICB that cancel the cumulative offset generated by the second stage amplifier circuit through the last stage amplifier circuit (i.e., amplifier circuits 201B-201C) during calibration mode. Offset calibration circuit 205 adjusts currents ICA and ICB during calibration mode until signal V4P equals signal V4N. The currents ICA and ICB that cause the voltage of signal V4P to equal the voltage of signal V4N while signals V2P and V2N equal supply voltage VCC during calibration mode are the currents ICA and ICB that cancel the cumulative offset of amplifier circuits 201B-201C. During normal mode, offset calibration circuit 205 continuously generates the currents ICA and ICB that cancel the cumulative offset of amplifier circuits 201B-201C. Offset calibration circuit 205 maintains the offset cancelation currents ICA and ICB constant during normal mode.

Figure 4:
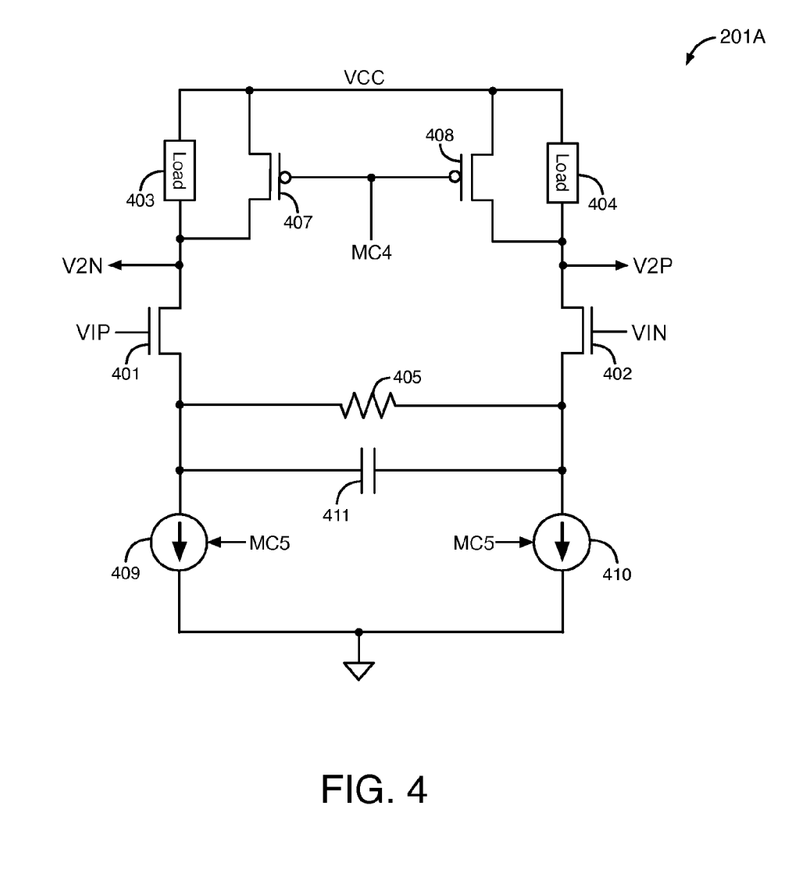
FIG. 4 illustrates an example of another one of the differential amplifier circuits shown in FIG. 2, according to an embodiment of the present invention.

FIG. 4 illustrates an example of differential amplifier circuit 201A, according to an embodiment of the present invention. Differential amplifier circuit 201A includes n-channel MOSFETs 401-402, load circuits 403-404, resistor 405, p-channel MOSFETs 407-408, current source circuits 409-410, and capacitor 411.

Load circuits 403-404 are coupled to a supply rail at supply voltage VCC. Load circuits 403-404 may be, for example, two passive resistors. Alternatively, each of the load circuits 403-404 may be a field-effect transistor.

Current source circuits 409-410 are coupled to the sources of transistors 401-402, respectively, and to a supply rail at the ground voltage. Transistors 401-402 are a differential pair of transistors. Resistor 405 and capacitor 411 are coupled in parallel between the sources of transistors 401-402. Signals VIP and VIN are provided to the gates of transistors 401 and 402, respectively. Signals V2P and V2N are generated at the drains of transistors 402 and 401, respectively.

As discussed above, differential amplifier circuit 201A is off during the calibration mode. Mode control signal MC5 is generated by offset calibration circuit 205 and provided to an input of each of the current source circuits 409 and 410. During normal mode, mode control signal MC5 is in a first logic state that causes current source circuits 409 and 410 to be on and conducting current from transistors 401-402 to ground, respectively. During calibration mode, mode control signal MC5 is in a second logic state that causes current source circuits 409 and 410 to be off so that current source circuits 409-410 do not conduct current from transistors 401-402 to ground.

The offsets in differential amplifier circuits 201 may change during the operation of equalizer circuit 200 in response to variations in the temperature of integrated circuit 102 and in response to changes in the supply voltage VCC. Equalizer circuit 200 may periodically transition from normal mode to calibration mode to recalibrate the offset cancelation currents ICA and ICB to values that cancel the cumulative offset of amplifier circuits 201B-201C. After offset cancelation currents ICA and ICB have been generated that cancel the cumulative offset of amplifier circuits 201B-201C, equalizer circuit 200 transitions to normal mode.

Transmitter circuit 111 continues to generate a varying differential signal VIP–VIN during both the normal and calibration modes of equalizer circuit 200. Each of transistors 401 and 402 has parasitic capacitance between its gate and its drain. When varying signals VIP and VIN are applied to the gates of transistors 401 and 402 during the calibration mode of equalizer circuit 200, AC coupling through the parasitic capacitances in transistors 401 and 402 generates variations (i.e., noise) in the voltages of signals V2N and V2P, respectively, even though current source circuits 409-410 are off. The amount of noise generated in signals V2N and V2P is proportional to the voltage swing of differential input signal VIP−VIN. Thus, a smaller voltage swing in differential input signal VIP−VIN generates less noise in signals V2N and V2P, and a larger voltage swing in differential input signal VIP−VIN generates more noise in signals V2N and V2P. The voltage swing of differential input signal VIP−VIN is a function of the resistances of termination circuits 216-217.

Turning off current source circuits 409-410 is not sufficient to maintain signals V2P and V2N at supply voltage VCC during the calibration mode of equalizer circuit 200 when signals VIP and VIN are varying. If signals V2P and V2N are not maintained at supply voltage VCC during calibration mode, differential voltage signal V4P−V4N does not accurately indicate the cumulative offset of amplifier circuits 201B-201C. If differential voltage signal V4P−V4N does not accurately indicate the cumulative offset of amplifier circuits 201B-201C during calibration mode, offset calibration circuit 205 does not generate currents ICA and ICB that cancel the cumulative offset of amplifier circuits 201B-201C.

P-channel transistor 407 is coupled in parallel with load circuit 403 between the supply rail at supply voltage VCC and the drain of n-channel transistor 401. P-channel transistor 408 is coupled in parallel with load circuit 404 between the supply rail at supply voltage VCC and the drain of n-channel transistor 402. Offset calibration circuit 205 generates mode control signal MC4. Mode control signal MC4 is provided to the gates of p-channel transistors 407 and 408. During the normal mode of equalizer circuit 200, offset calibration circuit 205 causes mode control signal MC4 to be at supply voltage VCC to maintain p-channel transistors 407-408 off.

During the calibration mode of equalizer circuit 200, offset calibration circuit 205 causes mode control signal MC4 to be at the ground voltage. When mode control signal MC4 is at the ground voltage, transistors 407-408 are on to short the output nodes of differential amplifier circuit 201A to supply voltage VCC. When transistors 407-408 are on during the calibration mode, transistors 407-408 conduct current between supply voltage VCC and transistors 401-402, respectively, causing voltages V2N and V2P to be closer to or at supply voltage VCC. Transistors 407-408 reduce variations (i.e., noise) in voltages V2N and V2P that are caused by input signals VIP and VIN varying during the calibration mode. As a result, differential voltage signal V4P−V4N more accurately indicates the cumulative offset of amplifier circuits 201B-201C during calibration mode, and offset calibration circuit 205 generates currents ICA and ICB that cancel more of the cumulative offset of amplifier circuits 201B-201C.

Figure 5A:
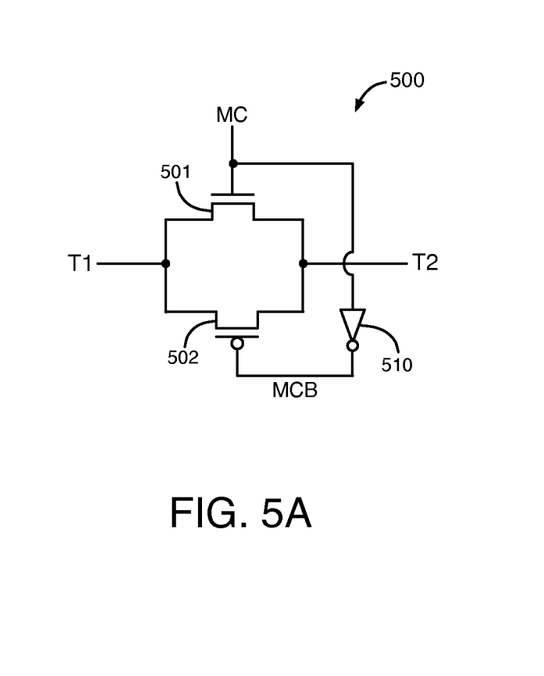
FIGS. 5A-5B illustrate examples of the pass gate circuits shown in FIG. 2, according to embodiments of the present invention.
Figure 5B:
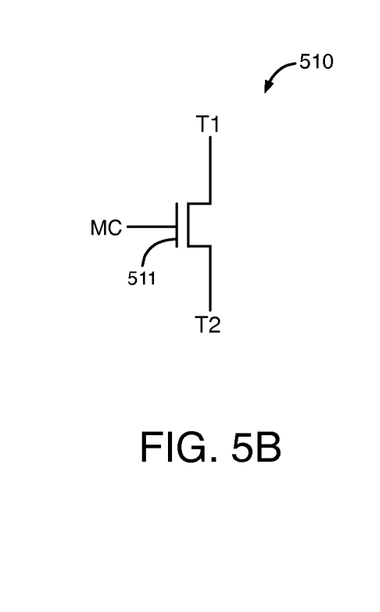

FIGS. 5A-5B illustrate examples of the pass gate circuits 211-214 shown in FIG. 2, according to embodiments of the present invention. Pass gate circuit 500 shown in FIG. 5A is an example of each of the pass gate circuits 211-214 shown in FIG. 2. Pass gate circuit 500 includes n-channel MOSFET 501, p-channel MOSFET 502, and CMOS inverter circuit 510. Mode control signal MC shown in FIG. 5A corresponds to one of mode control signals MC1-MC3.

When mode control signal MC is at supply voltage VCC, transistor 501 is on, inverter 510 pulls signal MCB to ground, and transistor 502 is on. Pass gate 500 is on when transistors 501-502 are on and conducting current between terminals T1 and T2. When mode control signal MC is at ground, transistor 501 is off, inverter 510 pulls signal MCB to supply voltage VCC, and transistor 502 is off. Pass gate 500 is off when transistors 501-502 are off and blocking current between terminals T1 and T2.

Pass gate circuit 510 shown in FIG. 5B is another example of each of the pass gate circuits 211-214 shown in FIG. 2. Pass gate circuit 510 includes n-channel MOSFET 511. Mode control signal MC shown in FIG. 5B is a corresponding one of mode control signals MC1-MC3. When mode control signal MC is at supply voltage VCC, transistor 511 is on, shorting together terminals T1 and T2, and therefore, pass gate circuit 510 is on. When mode control signal MC is at ground, transistor 511 is off, creating an open circuit between terminals T1 and T2, and therefore, pass gate circuit 510 is off.

Referring again to FIG. 2, one or more of the pass gate circuits 211-214 may be on during the calibration mode of equalizer circuit 200. In one embodiment, pass gate circuit 214 is on during the calibration mode of equalizer circuit 200 and off during the normal mode of equalizer circuit 200. The voltage of mode control signal MC3 determines whether pass gate circuit 214 is on or off. When pass gate circuit 214 is on, pass gate circuit 214 provides a low resistance conductive path between pin 221 and pin 222, bypassing termination circuits 216-217 and effectively shorting signal VIP with signal VIN. Because input signals VIP and VIN form a differential signal, shorting signal VIP with signal VIN through pass gate circuit 214 causes the voltages of VIP and VIN at the non-inverting and inverting inputs of differential amplifier circuit 201A to be at the common mode voltage VCM (or closer to VCM) during calibration mode. Thus, the input voltage swing of differential signal VIP−VIN is substantially reduced during calibration mode.

Causing the voltages at the inputs of differential amplifier circuit 201A to be at or closer to VCM reduces or eliminates variations in signals V2P and V2N during calibration mode. As a result, differential voltage signal V4P−V4N more accurately indicates the cumulative offset of amplifier circuits 201B-201C during calibration mode, which causes offset calibration circuit 205 to generate currents ICA and ICB that cancel more of the cumulative offset of amplifier circuits 201B-201C.

The common mode voltage VCM may be greater than or equal to the threshold voltages of transistors 401-402 in differential amplifier circuit 201A. If common mode voltage VCM is equal to or greater than the threshold voltages of transistors 401-402, transistors 401-402 may be on when the voltages VIP and VIN at the inputs of differential amplifier circuit 201A are at VCM during calibration mode. If transistors 401-402 are on during calibration mode, transistors 401-402 may draw current, causing variations in the voltages of signals V2P and V2N. Variations in the voltages of signals V2P and V2N during calibration mode may cause offset calibration circuit 205 to generate currents ICA and ICB that do not cancel the cumulative offset of amplifier circuits 201B-201C.

In another embodiment, pass gate circuits 211-213 are on during the calibration mode of equalizer circuit 200. Pass gate circuit 214 may be on or off during calibration mode in this embodiment. All of pass gate circuits 211-214 are off in normal mode.

Pass gate circuit 212 is coupled in parallel with termination circuit 216, and pass gate circuit 213 is coupled in parallel with termination circuit 217. The voltage of mode control signal MC2 determines whether each of pass gate circuits 212-213 is on or off. When pass gate circuits 212-213 are on, pass gate circuits 212-213 provide a low resistance conductive path between pins 221 and 222 that bypasses termination circuits 216-217 and that shorts signal VIP with signal VIN.

The voltage of mode control signal MC1 determines whether pass gate circuit 211 is on or off. When pass gate circuit 211 is on, pass gate circuit 211 provides a low resistance conductive path between the positive (+) and negative (−) terminals of voltage source circuit 220. When pass gate circuit 211 is on, pass gate circuit 211 pulls the voltage at node 230 to the ground voltage. When pass gate circuits 211-213 are on during calibration mode, pass gate circuits 211-213 pull the voltages at pins 221-222 to the ground voltage or closer to the ground voltage. The voltages of signals VIP and VIN during calibration mode depend on the amount of current drawn by pass gate circuits 211-213 in this embodiment.

If the threshold voltages of transistors 401-402 are greater than zero, transistors 401-402 are off when signals VIP and VIN are at the ground voltage. Maintaining transistors 401-402 off in calibration mode reduces the gate-to-drain capacitance in each of transistors 401 and 402, which reduces AC coupling from signals VIP and VIN to signals V2N and V2P. Pass gate circuits 211-213 reduce or eliminate variations in signals V2P and V2N during calibration mode by pulling the voltages of signals VIP and VIN to the ground voltage or closer to the ground voltage and by maintaining transistors 401-402 off. In this embodiment, differential voltage signal V4P-V4N is a more accurate indication of the cumulative offset of amplifier circuits 201B-201C during calibration mode. As a result, offset calibration circuit 205 generates currents ICA and ICB that cancel more of the cumulative offset of amplifier circuits 201B-201C.

According to another embodiment, pass gate circuits 212-213 are on and pass gate circuits 211 and 214 are off during the calibration mode of equalizer circuit 200. In this embodiment, the voltages of signals VIP and VIN at pins 221-222 are at the common mode voltage VCM during calibration mode. Transistors 401-402 may be on during calibration mode in this embodiment depending on the threshold voltages of transistors 401-402 and the voltage VCM, as described above with respect to the embodiment in which pass gate circuit 214 is on in calibration mode. All of pass gate circuits 211-214 are off in normal mode.

According to yet another embodiment, pass gate circuits 211 and 214 are on and pass gate circuits 212-213 are off during the calibration mode of equalizer circuit 200. All of pass gate circuits 211-214 are off in normal mode. In this embodiment, pass gate circuits 212-213 may be eliminated.

According to yet another embodiment, all four of pass gate circuits 211-214 are on during the calibration mode of equalizer circuit 200. In this embodiment, the voltages of signals VIP and VIN are grounded, as described above with respect to the embodiment in which pass gate circuits 211-213 are on in calibration mode. Pass gate circuits 211-214 are off in normal mode.

Figure 6:
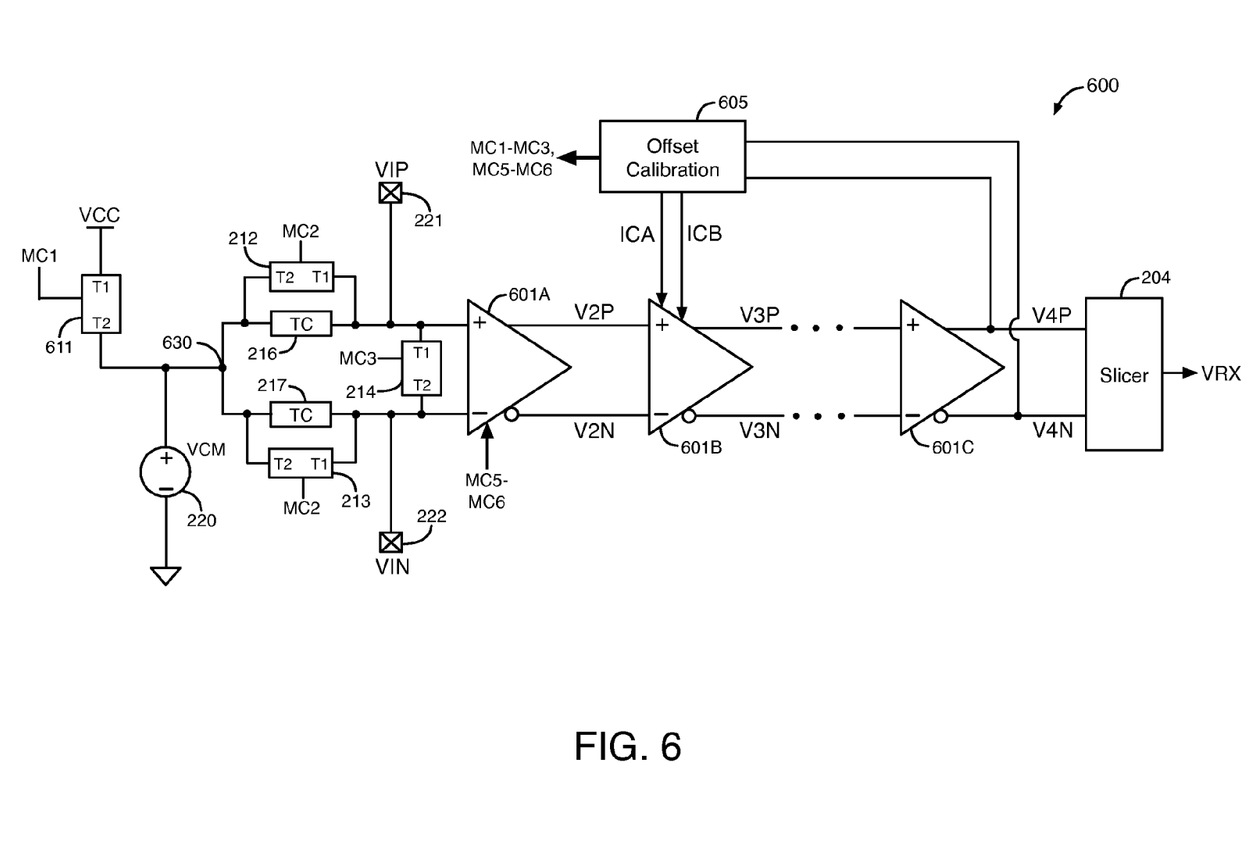
FIG. 6 illustrates another equalizer circuit, according to a further embodiment of the present invention.

FIG. 6 illustrates an equalizer circuit 600, according to another embodiment of the present invention. Equalizer circuit 600 is another example of equalizer circuit 112 shown in FIG. 1. Equalizer circuit 600 includes two or more stages of differential amplifier circuits 601 that are coupled in series. In the example of FIG. 6, equalizer circuit 600 includes differential amplifier circuits 601A-601C. In the embodiment of FIG. 6, each of the differential amplifier circuits 601 in equalizer circuit 600 includes a differential pair of p-channel MOSFETs. Equalizer circuit 600 also includes slicer circuit 204, offset calibration circuit 605, on-chip termination circuits 216-217, pass gate circuits 212-214, common mode voltage source 220, and pass gate circuit 611.

Equalizer circuit 600 is coupled to pins 221-222 of integrated circuit 102. Signals VIP and VIN are received from transmission lines 103 and 104 at inputs of equalizer circuit 600 through pins 221 and 222, respectively. Pins 221 and 222 are coupled to the non-inverting (+) and inverting (−) inputs, respectively, of differential amplifier circuit 601A. Equalizer circuit 600 functions in a normal mode and in a calibration mode, as described above with respect to equalizer circuit 200.

During normal mode, differential amplifier circuit 601A generates a differential output signal V2P-V2N based on differential input signal VIP-VIN. Differential amplifier circuit 601B generates a differential output signal V3P-V3N based on differential signal V2P-V2N. Differential amplifier circuit 601C generates a differential output signal V4P-V4N based on the differential output signal of the previous stage differential amplifier circuit 601. Signals V4P and V4N are provided to inputs of slicer circuit 204 and to inputs of offset calibration circuit 605.

In equalizer circuit 600, slicer circuit 204 functions as described above with respect to FIG. 2. Offset calibration circuit 605 generates offset cancelation currents ICA and ICB that cancel the cumulative offset generated by the second stage amplifier circuit through the last stage amplifier circuit (i.e., amplifier circuits 601B-601C). Offset calibration circuit 605 also generates five mode control signals MC1-MC3 and MC5-MC6.

Figure 7:
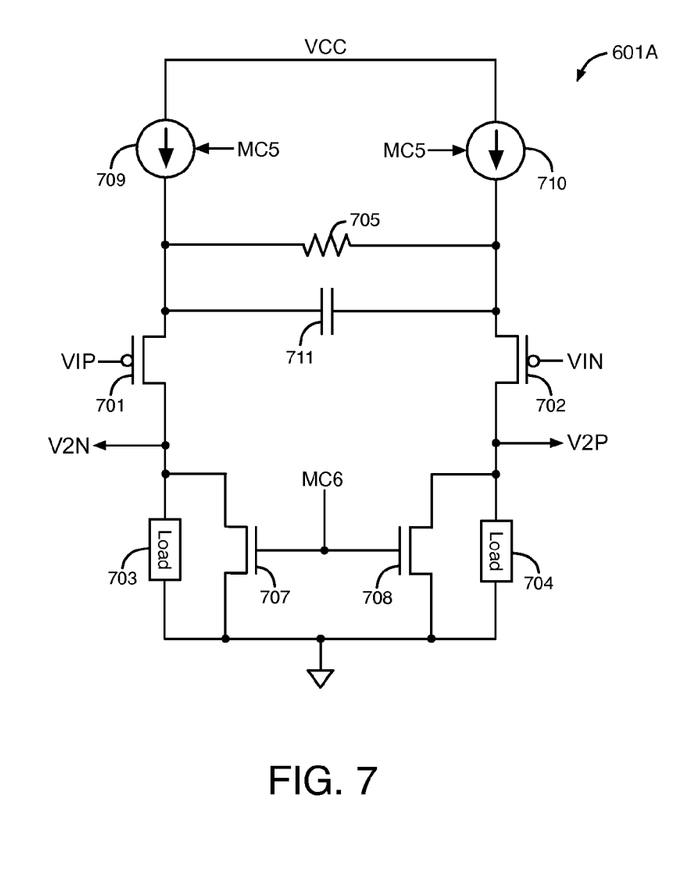
FIG. 7 illustrates an example of one of the differential amplifier circuits shown in FIG. 6, according to an embodiment of the present invention.

FIG. 7 illustrates an example of differential amplifier circuit 601A, according to an embodiment of the present invention. Differential amplifier circuit 601A includes p-channel MOSFETs 701-702, load circuits 703-704, resistor 705, n-channel MOSFETs 707-708, current source circuits 709-710, and capacitor 711. Signals VIP and VIN are provided to the gates of transistors 701 and 702, respectively. Signals V2P and V2N are generated at the drains of transistors 702 and 701, respectively.

Load circuits 703-704 are coupled to a supply rail at the ground voltage. Load circuits 703-704 may be, for example, passive resistors. Alternatively, each of the load circuits 703-704 may be a field-effect transistor (e.g., a MOSFET). Load circuits 703-704 are coupled to transistors 701-702, respectively.

Differential amplifier circuit 601A is off during the calibration mode. Mode control signal MC5 is provided to an input of each of the current source circuits 709 and 710 in the embodiment of FIGS. 6-7. During normal mode, mode control signal MC5 is in a first logic state that causes current source circuits 709-710 to be on and conducting current from supply voltage VCC to transistors 701-702. During calibration mode, mode control signal MC5 is in a second logic state that causes current source circuits 709 and 710 to be off so that current source circuits 709-710 do not conduct current from VCC to transistors 701-702.

N-channel transistor 707 is coupled in parallel with load circuit 703, and n-channel transistor 708 is coupled in parallel with load circuit 704. Mode control signal MC6 is provided to the gates of n-channel transistors 707-708. During the normal mode of equalizer circuit 600, offset calibration circuit 605 causes mode control signal MC6 to be at the ground voltage to maintain transistors 707-708 off.

During the calibration mode of equalizer circuit 600, offset calibration circuit 605 causes mode control signal MC6 to be at supply voltage VCC. When mode control signal MC6 is at supply voltage VCC, transistors 707-708 are on, pulling the output voltages V2P and V2N of differential amplifier circuit 601A to the ground voltage. When transistors 707-708 are on during the calibration mode, transistors 707-708 conduct current between transistors 701-702, respectively, and the supply rail at the ground voltage. Transistors 707-708 reduce variations in voltages V2N and V2P caused by input signals VIP and VIN varying during the calibration mode. As a result, differential voltage signal V4P–V4N more accurately indicates the cumulative offset generated by amplifier circuits 601B-601C during calibration mode, and offset calibration circuit 605 generates currents ICA and ICB that cancel more of the cumulative offset generated by amplifier circuits 601B-601C.

Referring again to FIG. 6, pass gate circuits 212-214 in equalizer circuit 600 function as described above with respect to the various embodiments of FIG. 2. Pass gate circuit 611 is coupled between node 630 and the supply rail at supply voltage VCC. Mode control signal MC1 is provided to an input of pass gate circuit 611. Pass gate circuits 500 and 510 are examples of pass gate circuit 611.

In an embodiment, offset calibration circuit 605 turns pass gate circuit 611 and pass gate circuits 212-213 on during the calibration mode of equalizer circuit 600. When pass gate circuits 611 and 212-213 are on, pass gate circuits 611 and 212-213 short the voltages VIP and VIN at pins 221-222 to supply voltage VCC. When the voltages VIP and VIN are at supply voltage VCC during calibration mode, p-channel transistors 701-702 in amplifier circuit 601A are off. Transistors 701-702 are maintained off during calibration mode to reduce variations in signals V2P and V2N. In this embodiment, offset calibration circuit 605 is able to generate currents ICA and ICB that fully compensate for the cumulative offset generated by amplifier circuits 601B-601C. Pass gate circuits 611 and 212-214 in equalizer circuit 600 are off in normal mode.

Figure 8:
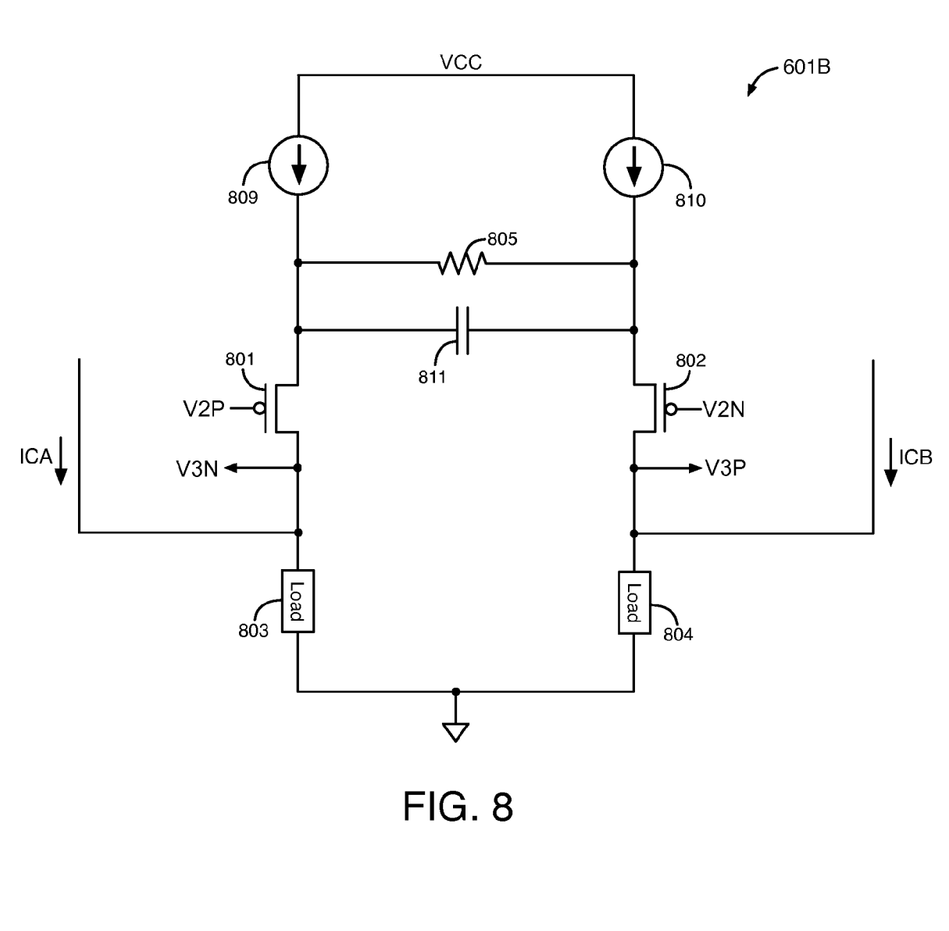
FIG. 8 illustrates an example of another one of the differential amplifier circuits shown in FIG. 6, according to an embodiment of the present invention.

FIG. 8 illustrates an example of differential amplifier circuit 601B, according to an embodiment of the present invention. Differential amplifier circuit 601B includes p-channel MOSFETs 801-802, load circuits 803-804, resistor 805, current source circuits 809-810, and capacitor 811. Load circuits 803-804 are coupled to a supply rail at the ground voltage. Load circuits 803-804 may be, for example, passive resistors. Alternatively, each of the load circuits 803-804 may be a field-effect transistor (e.g., a MOSFET). Load circuits 803-804 are coupled to transistors 801-802, respectively.

Current source circuits 809-810 are coupled to a supply rail at supply voltage VCC. Transistors 801-802 are a differential pair of transistors. Resistor 805 and capacitor 811 are coupled in parallel between the sources of transistors 801-802. Signals V2P and V2N are provided to the gates of transistors 801 and 802, respectively. Signals V3P and V3N are generated at the drains of transistors 802 and 801, respectively.

Current ICA is provided to the node between transistor 801 and load circuit 803. Current ICB is provided to the node between transistor 802 and load circuit 804. The current through load circuit 803 equals the sum of the current through transistor 801 and current ICA during a steady state. The current through load circuit 804 equals the sum of the current through transistor 802 and current ICB during a steady state. Currents ICA and ICB may be positive or negative.

When differential amplifier circuit 601A is off during the calibration mode, the output signals V2P and V2N of amplifier circuit 601A are both equal to or about equal to the ground voltage. If signals V2P and V2N both equal the ground voltage, and the cumulative offset generated by amplifier circuits 601B-601C equals zero, then the differential voltage V4P–V4N equals zero. If signals V2P and V2N both equal the ground voltage, and the cumulative offset generated by amplifier circuits 601B-601C does not equal zero, then the differential voltage V4P–V4N does not equal zero.

During the calibration mode, offset calibration circuit 605 adjusts currents ICA and ICB based on differential voltage V4P–V4N. Offset calibration circuit 605 determines the currents ICA and ICB that cancel the cumulative offset generated by amplifier circuits 601B-601C during calibration mode. Offset calibration circuit 605 adjusts currents ICA and ICB during calibration mode until the voltage of signal V4P equals the voltage of signal V4N. The currents ICA and ICB that cause the voltage of signal V4P to equal the voltage of signal V4N while signals V2P and V2N equal the ground voltage during calibration mode are the currents ICA and ICB that cancel the cumulative offset generated by amplifier circuits 601B-601C. During normal mode, offset calibration circuit 605 continuously generates the currents ICA and ICB that cancel the cumulative offset of amplifier circuits 601B-601C. Offset calibration circuit 605 maintains the offset cancelation currents ICA and ICB constant during normal mode.

Figure 9:
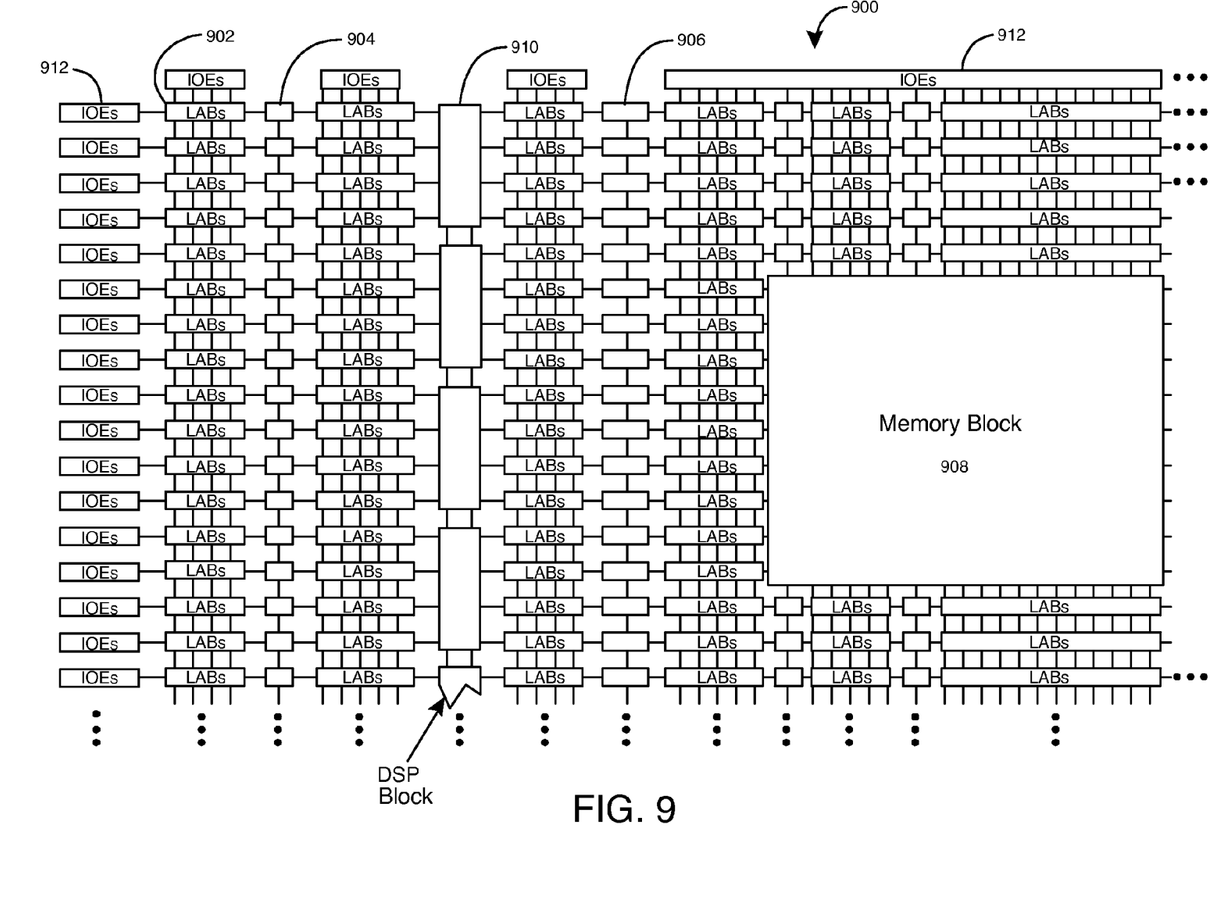
FIG. 9 is a simplified partial block diagram of a field programmable gate array (FPGA) that can include embodiments of the present invention.

FIG. 9 is a simplified partial block diagram of a field programmable gate array (FPGA) 900 that can include embodiments of the present invention. FPGA 900 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 900 includes a two-dimensional array of programmable logic array blocks (or LABs) 902 that are interconnected by a network of column and row interconnect conductors of varying length and speed. LABs 902 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 900 also includes a distributed memory structure including random access memory (RAM) blocks of varying sizes provided throughout the array. The RAM blocks include, for example, blocks 904, blocks 906, and block 908. These memory blocks can also include shift registers and first-in-first-out (FIFO) buffers.

FPGA 900 further includes digital signal processing (DSP) blocks 910 that can implement, for example, multipliers with add or subtract features. Input/output elements (IOEs) 912 support numerous single-ended and differential input/output standards. IOEs 912 include input and output buffers that are coupled to pins of the integrated circuit. The pins are external terminals of the FPGA die that can be used to route, for example, input data signals, output data signals, and supply voltages between the FPGA and one or more external devices. One or more of the IOEs 912 may include one or more equalizer circuits 112, 200, or 600. FPGA 900 is described herein for illustrative purposes. Embodiments of the present invention can be implemented in many different types of integrated circuits.

Figure 10:
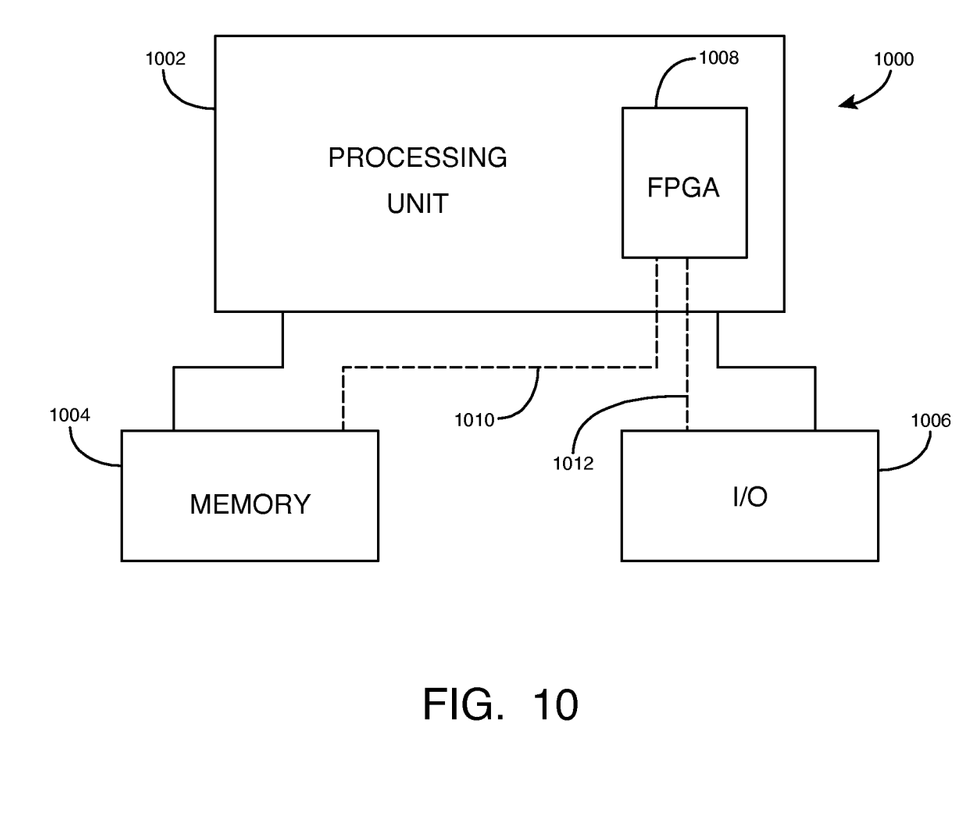
FIG. 10 shows a block diagram of an exemplary digital system that can embody techniques of the present invention.

Embodiments of the present invention can also be implemented in a system that has an FPGA as one of several components. FIG. 10 shows a block diagram of an exemplary digital system 1000 that can embody techniques of the present invention. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004, and an input/output (I/O) unit 1006 interconnected together by one or more buses. According to this exemplary embodiment, an FPGA 1008 is embedded in processing unit 1002. FPGA 1008 can serve many different purposes within the system of FIG. 10. FPGA 1008 can, for example, be a logical building block of processing unit 1002, supporting its internal and external operations. FPGA 1008 is programmed to implement the logical functions necessary to carry on its particular role in system operation. FPGA 1008 can be specially coupled to memory 1004 through connection 1010 and to I/O unit 1006 through connection 1012.

Processing unit 1002 can direct data to an appropriate system component for processing or storage, execute a program stored in memory 1004, receive and transmit data via I/O unit 1006, or other similar functions. Processing unit 1002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 can control the logical operations of the system. As another example, FPGA 1008 acts as a reconfigurable processor that can be reprogrammed as needed to handle a particular computing task. Alternatively, FPGA 1008 can itself include an embedded microprocessor. Memory unit 1004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a first amplifier circuit;
a second amplifier circuit comprising an input coupled to an output of the first amplifier circuit;
a first pass gate circuit coupled between first and second inputs of the first amplifier circuit, wherein the first pass gate circuit is on during calibration of the second amplifier circuit to short signals at the first and the second inputs of the first amplifier circuit;
an offset calibration circuit; and
a third amplifier circuit coupled to the offset calibration circuit, wherein the offset calibration circuit reduces a cumulative offset between the input of the second amplifier circuit and an output of the third amplifier circuit during the calibration of the second amplifier circuit.

2. The circuit of claim 1 further comprising:
a first termination circuit coupled to the first input of the first amplifier circuit; and
a second pass gate circuit coupled in parallel with the first termination circuit, wherein the second pass gate circuit is on during the calibration of the second amplifier circuit.

3. The circuit of claim 2 further comprising:
a second termination circuit coupled to the second input of the first amplifier circuit; and
a third pass gate circuit coupled in parallel with the second termination circuit, wherein the third pass gate circuit is on during the calibration of the second amplifier circuit.

4. The circuit of claim 3 further comprising:
a common mode voltage source coupled to the first and the second termination circuits; and
a fourth pass gate circuit coupled to the common mode voltage source, wherein the fourth pass gate circuit is on during the calibration of the second amplifier circuit to couple a node between the first and the second termination circuits to a node at one of a supply voltage or a ground voltage.

5. The circuit of claim 1, wherein the first amplifier circuit comprises:
a differential pair of first and second transistors;
a first load circuit coupled to the first transistor;
a second load circuit coupled to the second transistor;
a third transistor coupled in parallel with the first load circuit; and
a fourth transistor coupled in parallel with the second load circuit, wherein the third and the fourth transistors are on during the calibration of the second amplifier circuit to short a terminal of the first transistor and a terminal of the second transistor to a supply rail.

6. The circuit of claim 5, wherein the third and the fourth transistors are off during a normal mode of the first and the second amplifier circuits, and wherein the supply rail is at a supply voltage.

7. The circuit of claim 5, wherein the third and the fourth transistors are off during a normal mode of the first and the second amplifier circuits, and wherein the supply rail is at a ground voltage.

8. An equalizer circuit comprising:
a first amplifier circuit;
a second amplifier circuit comprising an input coupled to an output of the first amplifier circuit; and
a pass gate circuit coupled between first and second inputs of the first amplifier circuit, wherein the pass gate circuit is on during calibration of the second amplifier circuit to short signals at the first and the second inputs of the first amplifier circuit,
wherein the first amplifier circuit receives a first differential signal and generates a second differential signal based on the first differential signal during a normal mode of the equalizer circuit, and the second amplifier circuit receives the second differential signal and generates a third differential signal based on the second differential signal during the normal mode of the equalizer circuit, and wherein the pass gate circuit is off in the normal mode.

9. A circuit comprising:
a first amplifier circuit;
a second amplifier circuit comprising an input coupled to an output of the first amplifier circuit;
a first termination circuit coupled to a first input of the first amplifier circuit; and
a first pass gate circuit coupled in parallel with the first termination circuit, wherein the first pass gate circuit is on during calibration of the second amplifier circuit to short signals across the first termination circuit, and wherein the first pass gate circuit is off during a normal mode of the first and the second amplifier circuits.

10. The circuit of claim 9 further comprising:
a second termination circuit coupled to a second input of the first amplifier circuit; and
a second pass gate circuit coupled in parallel with the second termination circuit, wherein the second pass gate circuit is on during the calibration of the second amplifier circuit to short signals across the second termination circuit, and wherein the second pass gate circuit is off during the normal mode.

11. The circuit of claim 10 further comprising:
a common mode voltage source coupled to the first and the second termination circuits; and
a third pass gate circuit coupled to the common mode voltage source, wherein the third pass gate circuit is on during the calibration of the second amplifier circuit to couple a node between the first and the second termination circuits to a node at one of a supply voltage or a ground voltage.

12. The circuit of claim 9, wherein the circuit is an equalizer circuit, wherein the first amplifier circuit receives a first differential signal and generates a second differential signal based on the first differential signal during the normal mode, and the second amplifier circuit receives the second differential signal and generates a third differential signal based on the second differential signal during the normal mode.

13. A circuit comprising:
a first amplifier circuit comprising a differential pair of first and second transistors, a first load circuit coupled to a terminal of the first transistor, a second load circuit coupled to a terminal of the second transistor, a third transistor coupled to the first load circuit, and a fourth transistor coupled to the second load circuit; and
a second amplifier circuit comprising an input coupled to an output of the first amplifier circuit, wherein the third transistor is on during calibration of the second amplifier circuit to short the terminal of the first transistor to a supply rail, wherein the fourth transistor is on during the calibration of the second amplifier circuit to short the terminal of the second transistor to the supply rail, and wherein the third and the fourth transistors are off during a normal mode of the first and the second amplifier circuits.

14. The circuit of claim 13 further comprising:
a first termination circuit coupled to a first input of the first amplifier circuit; and
a first pass gate circuit coupled in parallel with the first termination circuit, wherein the first pass gate circuit is on during the calibration of the second amplifier circuit to short signals across the first termination circuit, and wherein the first pass gate circuit is off during the normal mode.

15. The circuit of claim 14 further comprising:
a second termination circuit coupled to a second input of the first amplifier circuit; and
a second pass gate circuit coupled in parallel with the second termination circuit, wherein the second pass gate circuit is on during the calibration of the second amplifier circuit to short signals across the second termination circuit, wherein the second pass gate circuit is off during the normal mode, and wherein the supply rail receives one of a supply voltage or a ground voltage.

16. A method comprising:
generating a second differential signal based on a first differential signal using a first amplifier circuit during a normal mode;
generating a third differential signal based on the second differential signal using a second amplifier circuit during the normal mode;
turning on a first pass gate circuit during calibration of the second amplifier circuit to short signals across a first termination circuit, wherein the first termination circuit is coupled to a first input of the first amplifier circuit; and
turning off the first pass gate circuit during the normal mode.

17. The method of claim 16 further comprising:
turning on a second pass gate circuit during the calibration of the second amplifier circuit to short together signals at the first input and a second input of the first amplifier circuit; and
turning off the second pass gate circuit during the normal mode, wherein the second pass gate circuit is coupled between the first and the second inputs of the first amplifier circuit.

18. The method of claim 17 further comprising:
turning on a third pass gate circuit during the calibration of the second amplifier circuit to short signals across a second termination circuit, and wherein the second termination circuit is coupled to the second input of the first amplifier circuit; and
turning off the third pass gate circuit during the normal mode.

19. The method of claim 18 further comprising:
turning on a fourth pass gate circuit during the calibration of the second amplifier circuit to couple a node between the first and the second termination circuits to a supply rail, and wherein a common mode voltage source is coupled to the node between the first and the second termination circuits, and wherein the first and the second amplifier circuits are part of an equalizer circuit.

20. A method comprising:
generating a second differential signal based on a first differential signal using a first amplifier circuit during a normal mode;
generating a third differential signal based on the second differential signal using a second amplifier circuit during the normal mode;
turning on a first transistor during calibration of the second amplifier circuit to short a terminal of a second transistor to a supply rail;
turning on a third transistor during the calibration of the second amplifier circuit to short a terminal of a fourth transistor to the supply rail; and
turning off the first and the third transistors during the normal mode, wherein the second and the fourth transistors are a differential pair in the first amplifier circuit, wherein a first load circuit is coupled to the terminal of the second transistor, and wherein a second load circuit is coupled to the terminal of the fourth transistor.

* * * * *